United States Patent
Wu

(10) Patent No.: US 8,766,960 B2
(45) Date of Patent: Jul. 1, 2014

(54) IMAGE DISPLAY SYSTEM

(75) Inventor: Tse-Hung Wu, Yonghe (TW)

(73) Assignee: Innolux Corporation, Chu-Nan (TW)

( * ) Notice: Subject to any disclaimer, the term of this patent is extended or adjusted under 35 U.S.C. 154(b) by 810 days.

(21) Appl. No.: 12/822,115

(22) Filed: Jun. 23, 2010

(65) Prior Publication Data
US 2010/0328280 A1 Dec. 30, 2010

Related U.S. Application Data

(60) Provisional application No. 61/220,457, filed on Jun. 25, 2009.

(30) Foreign Application Priority Data

May 31, 2010 (TW) ................................ 99117380 A

(51) Int. Cl.
G06F 3/038 (2013.01)
(52) U.S. Cl.
USPC ........... 345/206; 345/204; 345/205; 345/100; 345/98
(58) Field of Classification Search
None
See application file for complete search history.

(56) References Cited

U.S. PATENT DOCUMENTS

| 2006/0061535 | A1* | 3/2006 | Kim et al. | 345/98 |
| 2006/0187175 | A1 | 8/2006 | Lo et al. | |
| 2008/0012842 | A1* | 1/2008 | Mori | 345/206 |
| 2008/0042962 | A1 | 2/2008 | Hung | |
| 2009/0040203 | A1* | 2/2009 | Kim et al. | 345/204 |

FOREIGN PATENT DOCUMENTS

| TW | I270029 | 1/2007 |
| TW | 200837668 | 9/2008 |

* cited by examiner

Primary Examiner — Joseph Haley
Assistant Examiner — Ifedayo Iluyomade
(74) Attorney, Agent, or Firm — Liu & Liu

(57) ABSTRACT

An image display system is disclosed. A gate driver drives includes a first side driving circuit and a second side driving circuit. The first and the second side driving circuits are disposed on the both sides of the pixel array. A first shift register receives a first shifted signal to generate a second shifted signal such that the gate driver drives a first row of pixels. A second shift register receives a third shifted signal to generate a fourth shifted signal. A third shift register is coupled to the second shift register and receives the fourth shifted signal to generate a fifth shifted signal such that the gate driver drives a second row of pixels. The first and the third shifted signals are simultaneously generated according to a vertical start pulse, and the second and the fourth shifted signals are simultaneously output.

14 Claims, 8 Drawing Sheets

IMAGE DISPLAY SYSTEM

CROSS REFERENCE TO RELATED APPLICATIONS

This application claims the benefit of U.S. Provisional Application No. 61/220,457 filed Jun. 25, 2009, the entirety of which is incorporated by reference herein.

This Application claims priority of Taiwan Patent Application No. 99117380, filed on May 31, 2010, the entirety of which is incorporated by reference herein.

BACKGROUND OF THE INVENTION

1. Field of the Invention

The invention relates to an image display system, and more particularly to a gate driver thereof.

2. Description of the Related Art

FIG. 1 is a schematic diagram of a pixel array. The pixels in one column are coupled to the same data line. For example, the pixels P11, P21 and P31 in a first column are coupled to the data line D1. The pixels P12, P22 and P32 in a second column are coupled to the data line D2. Thus, the pixels in the same column are driven in different periods using the same data line. As shown in FIG. 1, the gate driving signals S1", S2" and S3" are utilized to activate the pixels in different periods. Thus, the pixels use the same data line.

However, it is important to reduce size of a circuit generating the gate driving signals S1", S2" and S3".

BRIEF SUMMARY OF THE INVENTION

In accordance with an embodiment, an image display system comprises a pixel array, a control chip and a gate driver. The pixel array comprises a first row of pixels and a second row of pixels. The control chip generates a vertical start pulse. The gate driver drives the pixel array and comprises a first side driving circuit and a second side driving circuit. The first side driving circuit is disposed on a first side of the pixel array and comprises a first shift register. The first shift register is coupled to the pixel array. The first shift register receives a first shifted signal to generate a second shifted signal during a first period such that the gate driver outputs a first gate driving signal to the pixel array for driving the first row of pixels. The second side driving circuit is disposed on a second side of the pixel array. The first side is opposite to the second side. The second side driving circuit comprises a second shift register and a third shift register. The second shift register receives a third shifted signal to generate a fourth shifted signal during the first period. The third shift register is coupled to the second shift register. The third shift register receives the fourth shifted signal to generate a fifth shifted signal during the first period such that the gate driver outputs a second gate driving signal to drive the second row of pixels. The first and the third shifted signals are simultaneously generated according to the vertical start pulse and the second and the fourth shifted signals are simultaneously output.

In accordance with an embodiment, a first side driving circuit comprises a fourth shift register, a first switch, a second switch, a third switch and a fourth switch, and a first side driving circuit comprises a fifth switch, a sixth switch, a seventh switch and a eighth switch. The fourth shift register is coupled to the first shift register. The fourth shift register receives the second shifted signal to generate a sixth shifted signal during the first period, and the fifth and the sixth shifted signals are simultaneously output. The first switch is coupled between an input terminal of the first shift register and the control chip. The second switch is coupled between an output terminal of the first shift register and an input terminal of the fourth shift register. The third switch is coupled between the input terminal of the fourth shift register and the control chip to transmit a seventh shifted signal during a second period. The seventh shifted signal is generated according to the vertical start pulse. The fourth switch is coupled between an output terminal of the fourth shift register and the input terminal of the first shift register. The fifth switch is coupled between an input terminal of the second shift register and the control chip. The sixth switch is coupled between an output terminal of the second shift register and an input terminal of the third shift register. The seventh switch is coupled between the input terminal of the third shift register and the control chip to transmit an eighth shifted signal during the second period. The eighth shifted signal is generated according to the vertical start pulse, and the seventh and the eighth shifted signals are simultaneously generated according to the vertical start pulse. The eighth switch is coupled to an output terminal of the third shift register and the input terminal of the second shift register. The first, the second, the fifth and the sixth switches are turned on during the first period and the first, the second, the fifth and the sixth switches are turned off during the second period. The third, the fourth, the seventh and the eighth switches are turned off during the first period and the third, the fourth, the seventh and the eighth switches are turned on during the second period.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
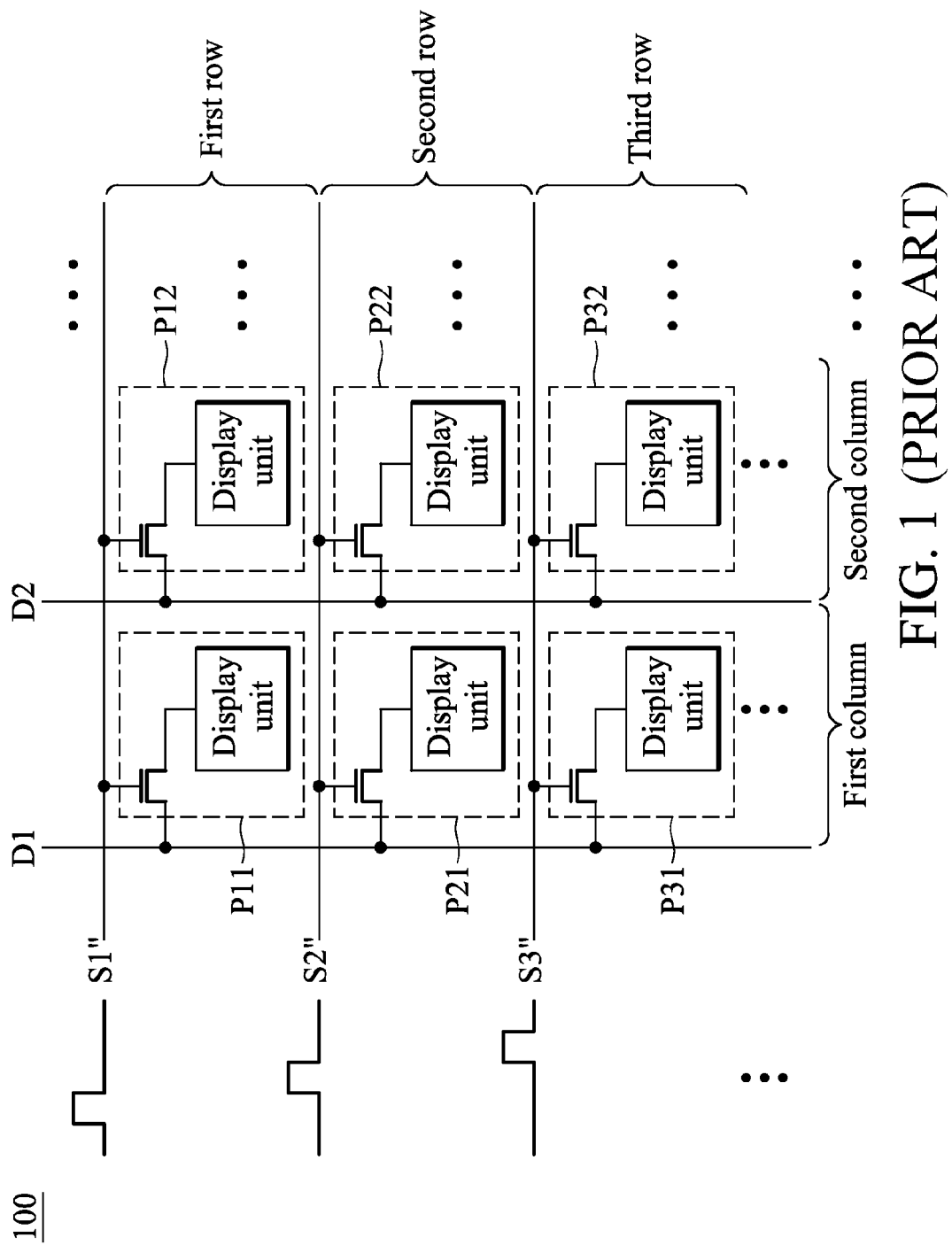
FIG. 1 is a schematic diagram of a pixel array.
Figure 2:
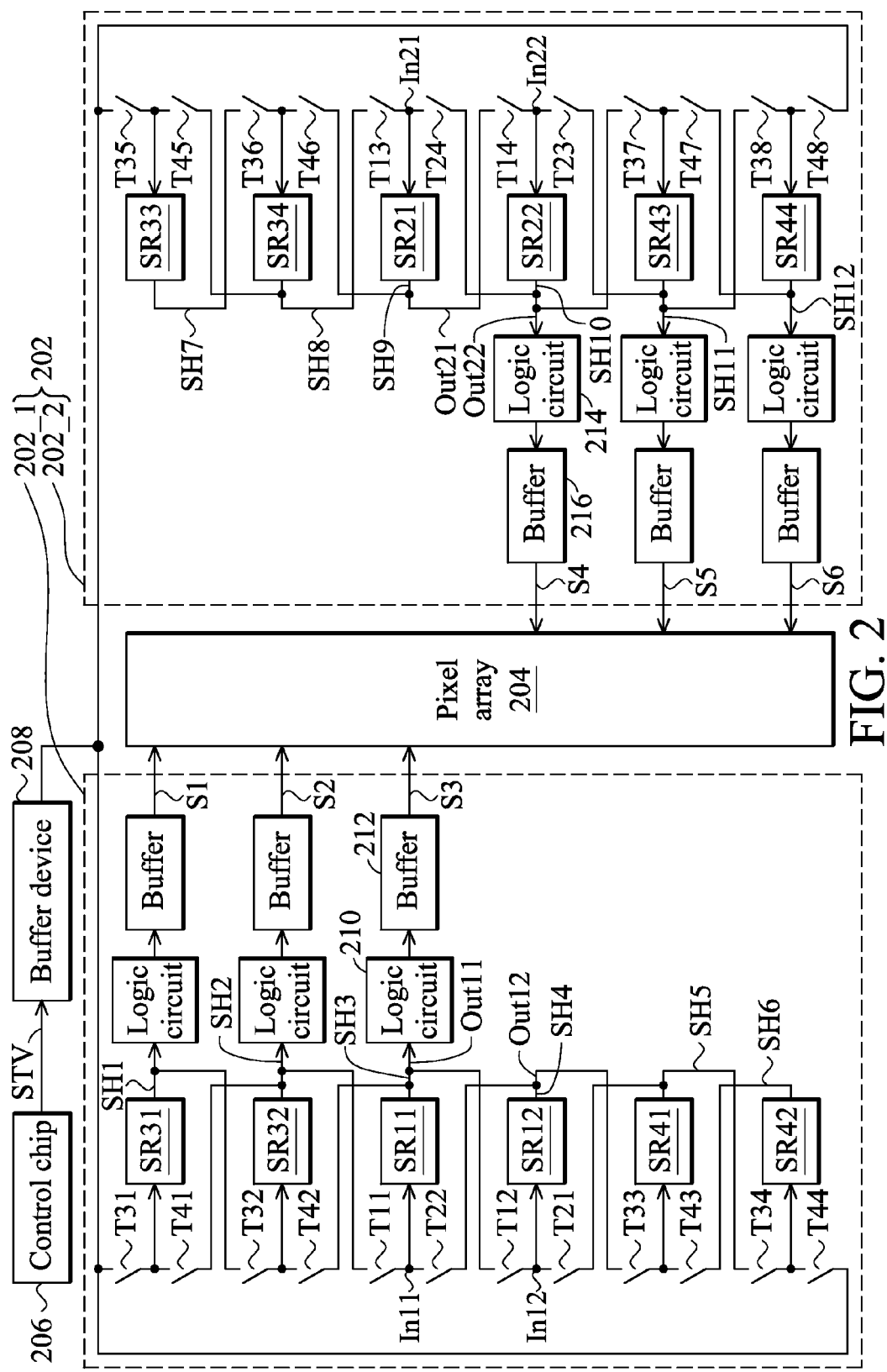
FIG. 2 is a schematic diagram of an exemplary embodiment of an image display system.

FIG. 2 is a schematic diagram of an exemplary embodiment of an image display system. The gate driver 202 comprises a first side driving circuit 202_1 and a second side driving circuit 202_2. The first side driving circuit 202_1 and the second side driving circuit 202_2 are disposed on both sides of the pixel array 204. The first side driving circuit 202_1 is disposed on the left side of the pixel array 204. The second side driving circuit 202_2 is disposed on the right side of the pixel array 204. The top half pixels of the pixel array 204 are driven by the first side driving circuit 202_1. The bottom half pixels of the pixel array 204 are driven by the second side driving circuit 202_2. For clarity, only some related circuits, which generate gate driving signals to drive six rows of pixels, are shown. As shown in FIG. 2. the first side driving circuit 202_1 at least comprises a first shift register SR11 and a fourth shift register SR12 and the second side driving circuit 202_2 at least comprises a second shift register SR21 and a third shift register SR22. In this embodiment, each of the first shift register SR11, the second shift register SR21, the third shift register SR22 and the fourth shift register SR12 generates a shifted signal to the next shift register according to a received signal (e.g. a shifted signal output from the previous shift register or a vertical start pulse STV output from a control chip 206). In this embodiment, the shift register delays an input signal and outputs the delayed signal. In other embodiments, circuits delaying an input signal can serve as the shift register of the present application.

The first shift register SR11 of the first side driving circuit 202_1 comprises an input terminal In11 and an output terminal Out11. The output terminal Out11 provides a second shifted signal SH3. The corresponding logic circuit 210 and the corresponding buffer 212 transform the second shifted signal SH3 into a first gate driving signal S3 to drive a first row of pixels of the pixel array 204. The second shift register SR21 of the second side driving circuit 202_2 comprises an input terminal In21 and an output terminal Out21. The third shifted signal SH8 on the input terminal In21 synchronizes the first shifted signal SH2 on the output terminal In 11 of the first shift register SR11. In this embodiment, when a first signal synchronizes a second signal, it represents that the first and the second signals are simultaneously switched to a high level or simultaneously switched to a low level. In other words, the third shifted signal SH8 received by the input terminal In21 of the second shift register SR21 and the first shifted signal SH2 on the input terminal In11 of the first shift register SR11 are simultaneously generated according to the vertical start pulse STV. The third shift register SR22 of the second side driving circuit 202_2 comprises an input terminal In22 and an output terminal Out22. The input terminal In22 receives the fourth shifted signal SH9 transmitted from the output terminal Out21 of the second shift register SR21. The corresponding logic circuit 214 and the corresponding buffer 216 transforms the fifth shifted signal SH10 output from the output terminal Out22 into a second gate driving signal S4 to drive a second row of pixels of the pixel array 204. Compared with the first shift register SR11 and the third shift register SR22, the fourth shifted signal SH9 of the output terminal Out21 of the second shift register SR21 is not transmitted to a logic circuit and a buffer. Note that the fourth shifted signal SH9 of the output terminal Out21 does not directly drive any row of pixels of the pixel array 204.

In this embodiment, the first side driving circuit 202_1 further comprises a fourth shift register SR12, a first switch T11, a second switch T12, a third switch T21 and a fourth switch T22. The second side driving circuit 202_2 further comprises a fifth switch T13, a sixth switch T14, a seventh switch T23 and a eighth switch T24. In this embodiment, the gate driver 202 is operated in a normal mode during a first period. In the normal mode, the first switch T11 and the second switch T12 of the first side driving circuit 202_1 and the fifth switch T13 and the sixth switch T14 of the second side driving circuit 202_2 are turned on. The gate driver 202 is operated in an anti-scan mode during a second period. In the anti-scan mode, the third switch T21 and the fourth switch T22 of the first side driving circuit 202_1 and the seventh switch T23 and the eighth switch T24 of the second side driving circuit 202_2 are turned on.

The fourth shift register SR12 comprises an input terminal In12 and an output terminal Out12. The input terminal In12 is coupled to the output terminal Out11 of the first shift register SR11. The first switch T11 is coupled between the input terminal In11 of the first shift register SR11 and the control chip 206. The second switch T12 is coupled between the output terminal Out11 of the first shift register SR11 and the input terminal In12 of the fourth shift register SR12. The fifth switch T13 is coupled between the input terminal In21 of the second shift register SR21 and the control chip 206. The sixth switch T14 is coupled between the output terminal Out21 of the second shift register SR21 and the input terminal In22 of the third shift register SR22. The third switch T21 is coupled between the input terminal In 12 of the fourth shift register SR12 and the control chip 206. The fourth switch T22 is coupled to the output terminal Out12 of the fourth shift register SR12 and the input terminal In11 of the first shift register SR11. The seventh switch T23 is coupled between the input terminal In22 of the third shift register SR22 and the control chip 206. The eighth switch T24 is coupled between the output terminal Out22 of the third shift register SR22 and an input terminal In21 of the second shift register SR21. The control chip 206 provides a control signal, such as a vertical start pulse STV, so that the gate driver 202 comprising the first side driving circuit 202_1 and the second side driving circuit 202_2 may drive each row of pixels of the pixel array 204 according to the control signal generated by the control chip 206. The vertical start pulse STV is further amplified by a buffer device 208 and the amplified pulse is provided to the gate driver 202.

During the first period, the first switch T11, the second switch T12, the fifth switch T13 and the sixth switch T14 are turned on and the third switch T21, the fourth switch T22, the seventh switch T23 and the eighth switch T24 are turned off. Thus, the first shift register SR11 receives the first shifted signal SH2 via the first switch T11 and outputs the second shifted signal SH3 to the fourth shift register SR12 via the second switch T12. Further, the second shift register SR21 receives the third shifted signal SH8 via the fifth switch T13 and outputs the fourth shifted signal SH9 to the third shift register SR22 via the sixth switch T14. Next, the fourth shift register SR12 generates the sixth shifted signal SH4 according to the second shifted signal SH3. The third shift register SR22 generates the fifth shifted signal SH10 according to the fourth shifted signal SH9. Since the first gate driving signal S3 is generated according to the second shifted signal SH3 and the second gate driving signal S4 is generated according to the fifth shifted signal SH10, the first gate driving signal S3 is generated before than the second gate driving signal S4.

During the second period, the first switch T11, the second switch T12, the fifth switch T13 and the sixth switch T14 are turned off and the third switch T21, the fourth switch T22, the seventh switch T23 and the eighth switch T24 are turned on. Thus, the fourth shift register SR12 receives the seventh shifted signal SH5 via the third switch T21, generates the sixth shifted signal SH4 according to the seventh shifted signal SH5 and outputs the sixth shifted signal SH4 to the first shift register SR11 via the fourth switch T22. The third shift register SR22 receives the eighth shifted signal SH11 via the seventh switch T23, generates the fifth shifted signal SH10 according to the eighth shifted signal SH11 and outputs the fifth shifted signal SH 10 to the second shift register SR21 via the eighth switch T24.

Next, the first shift register SR11 generates the second shifted signal SH3 according to the sixth shifted signal SH4 and the second shift register SR21 generates the fourth shifted signal SH9 according to the fifth shifted signal SH10. Since the second gate driving signal S4 is generated according to the fifth shifted signal SH10 and the first gate driving signal S3 is generated according to the second shifted signal SH3, the second gate driving signal S4 is generated before than the first gate driving signal S3.

Refer to FIG. 2, the gate driver 202 further comprises plurality of the shift registers SR31-SR34, SR41-SR44, plurality of the switches T31-T38 and T41-T48. The fifth shift register SR32, the sixth shift register SR31, the seventh shift register SR41, the eighth shift register SR42, the ninth switch T42, the tenth switch T32, the eleventh switch T41, the twelfth switch T31, the thirteenth switch T33, the fourteenth switch T43, the fifteenth switch T34 and the sixteenth switch T44 are disposed within the first side driving circuit 202_1. The ninth shift register SR34, the tenth shift register SR33, the eleventh shift register SR43, the twelfth shift register SR44, the seventeenth switch T46, the eighteenth switch T36, the nineteenth switch T45, the twentieth switch T35, the twenty-first switch T37, the twenty-second switch T47, the twenty-third switch T38 and the twenty-fourth switch T48 are disposed within the second side driving circuit 202_2.

The fifth shift register SR32 is disposed between the first switch T11 and the control chip 206. The sixth shift register SR31 is disposed between the fifth shift register SR32 and the control chip 206. The seventh shift register SR41 is disposed between the third switch T21 and the control chip 206. The eighth shift register SR42 is disposed between the seventh shift register SR41 and the control chip 206. The ninth shift register SR34 is disposed between the fifth switch T13 and the control chip 206. The tenth shift register SR33 is disposed between the ninth shift register SR34 and the control chip 206. The eleventh shift register SR43 is disposed between the seventh switch T23 and the control chip 206. The twelfth shift register SR44 is disposed between the eleventh shift register SR43 and the control chip 206.

During the first period, the tenth switch T32, the twelfth switch T31, the thirteenth switch T33, the fifteenth switch T34, the eighteenth switch T36, the twentieth switch T35, the twenty-first switch T37, the twenty-third switch T38, the first switch T11, the second switch T12, the fifth switch T13 and the sixth switch T14 are turned on such that the shifted signals SH1-SH12 are transmitted from the top shift register to the bottom shift register. The shifted signals SH1-SH12 are generated according to the vertical start pulse STV. For example, the sixth shift register SR31 receives the vertical start pulse STV via the twelfth switch T31. The sixth shift register SR31 generates the ninth shifted signal SH1 according to the vertical start pulse STV. The vertical start pulse STV is output from the buffer device 208. The ninth shifted signal SH1 is transmitted to the fifth shift register SR32 via the tenth switch T32. At this time, the corresponding logic circuit and the corresponding buffer transform the ninth shifted signal SH1 into a third gate driving signal S1. The tenth shift register SR33 receives the vertical start pulse STV via the twentieth switch T35. The tenth shift register SR33 generates the tenth shifted signal SH7 according to the vertical start pulse STV. The vertical start pulse STV is provided by the buffer device 208. The eighteenth switch T36 transmits the tenth shifted signal SH7 to the ninth shift register SR34. The fifth shift register SR32 generates a first shifted signal SH2 according to the ninth shifted signal SH1 and outputs the first shifted signal SH2 to the first shift register SR11. At this time, the corresponding logic circuit and the corresponding buffer transform the first shifted signal SH2 into a fourth gate driving signal S2. The ninth shift register SR34 generates the third shifted signal SH8 according to the tenth shifted signal SH7 and then outputs the third shifted signal SH8 to the second shift register SR21 via the fifth switch T13.

Next, the first shift register SR11 generates the second shifted signal SH3 according to the first shifted signal SH2 and outputs the second shifted signal SH3 to the fourth shift register SR12 via the second switch T12. At this time, the corresponding logic circuit 210 and the corresponding buffer 212 transform the second shifted signal SH3 into the first gate driving signal S3. The second shift register SR21 generates the fourth shifted signal SH9 according to the third shifted signal SH8 and outputs the fourth shifted signal SH9 to the third shift register SR22 via the sixth switch T14. Next, the fourth shift register SR12 generates the sixth shifted signal SH4 according to the second shifted signal SH3 and outputs the sixth shifted signal SH4 to the seventh shift register SR41 via the thirteenth switch T33. The third shift register SR22 generates the fifth shifted signal SH10 according to the fourth shifted signal SH9 and outputs the fifth shifted signal SH10 to the eleventh shift register SR43 via the twenty-first switch T37. At this time, the corresponding logic circuit 214 and the corresponding buffer 216 transform the fifth shifted signal SH10 into the second gate driving signal S4.

Next, the seventh shift register SR41 generates the seventh shifted signal SH5 according to the sixth shifted signal SH4 and outputs the seventh shifted signal SH5 to the eighth shift register SR42 via the fifteenth switch T34. The eleventh shift register SR43 generates the eighth shifted signal SH11 according to the fifth shifted signal SH10 and outputs the eighth shifted signal SH11 to the twelfth shift register SR44 via the twenty-third switch T38. At this time, the corresponding logic circuit and the corresponding buffer transform the eighth shifted signal SH11 into the fifth gate driving signal S5. Next, the eighth shift register SR42 generates the eleventh shifted signal SH6 according to the seventh shifted signal SH5. The twelfth shift register SR44 generates the twelfth shifted signal SH12 according to the eighth shifted signal SH11. At this time, the corresponding logic circuit and the corresponding buffer transform the twelfth shifted signal SH12 into the sixth gate driving signal S6. Since the first gate driving signal S3 is generated according to the second shifted signal SH3 and the second gate driving signal S4 is generated according to the fifth shifted signal SH10, the first gate driving signal S3 is generated before than the second gate driving signal S4.

The signal (e.g. the first shifted signal SH2) transmitted by the first switch T11 is generated by the sixth shift register SR31 and the fifth shift register SR32. The signal (e.g. the third shifted signal SH8) transmitted by the fifth switch T13 is generated by the ninth shift register SR34 and the tenth shift register SR33. Since the number of the shift registers (e.g. SR31 and SR32) is the same as the number of the shift registers (e.g. SR33 and SR34), the first shifted signal SH2 is transmitted to the input terminal In11 of the shift register SR11 and simultaneously, the third shifted signal SH8 is transmitted to the input terminal In21 of the shift register SR21. The first shifted signal SH2 and the third shifted signal SH8 are generated according to the vertical start pulse STV. In other words, the ninth shifted signal SH1 and the tenth shifted signal SH7 are simultaneously generated. The first shifted signal SH2 and the third shifted signal SH8 are simultaneously generated. The second shifted signal SH3 and the fourth shifted signal SH9 are simultaneously generated and so on. The conventional control chip is required to provide different vertical start pulses to driving circuits disposed on both sides of a pixel array. The conventional vertical start pulses comprise different delay times. In this embodiment, the control chip 206 provides a vertical start pulse STV via a single pin. The shifted signals SH1-SH6 in the first side driving circuit 202_1 and the shifted signal SH7-SH12 in the second side driving circuit 202_2 are simultaneously transmitted. The shifted signals SH1-SH12 are generated according to the vertical start pulse STV. Thus, the pin number of the control chip 206 is reduced and the circuit is simple when compared to the conventional control chip. In addition, only one buffer device (e.g. 208) is required to transmit the vertical start pulse STV generated by the control chip 206 to the first side driving circuit 202_1 and the second side driving circuit 202_2. Furthermore, since the circuit design of the gate driver is simple, the size of the gate driver is small and the sizes of circuits in both sides of the pixel array are small.

During the second period, the ninth switch T42, the eleventh switch T41, the fourteenth switch T43, the sixteenth switch T44, the seventeenth switch T46, the nineteenth switch T45, the twenty-second switch T47, the twenty-fourth switch T48, the third switch T21, the fourth switch T22, the seventh switch T23 and the eighth switch T24 are turned on such that each of the shifted signals SH1-SH12 is transmitted from the bottom shift register to the top shift register. The shifted signals SH1-SH12 are generated according to the vertical start pulse STV. For example, the twelfth shift register SR44 receives the vertical start pulse STV provided by the buffer device 208 via the twenty-fourth switch T48. The twelfth shift register SR44 generates the twelfth shifted signal SH12 according to the vertical start pulse STV and outputs the twelfth shifted signal SH12 to the eleventh shift register SR43 via the twenty-second switch T47. At this time, the corresponding logic circuit and the corresponding buffer transform the twelfth shifted signal SH12 into the sixth gate driving signal S6. The eighth shift register SR42 receives the vertical start pulse STV provided by the buffer device 208 via the sixteenth switch T44. The eighth shift register SR42 generates the eleventh shifted signal SH6 according to the vertical start pulse STV and outputs the eleventh shifted signal SH6 to the seventh shift register SR41 via the fourteenth switch T43. Then, the eleventh shift register SR43 generates the eighth shifted signal SH11 according to the twelfth shifted signal SH12 and outputs the eighth shifted signal SH11 to the third shift register SR22 via the seventh switch T23. At this time, the corresponding logic circuit and the corresponding buffer transform the eighth shifted signal SH11 into the fifth gate driving signal S5. The seventh shift register SR41 generates the seventh shifted signal SH5 according to the eleventh shifted signal SH6 and outputs the seventh shifted signal SH5 to the fourth shift register SR12 via the third switch T21.

Next, the third shift register SR22 generates the fifth shifted signal SH10 according to the eighth shifted signal SH11 and outputs the fifth shifted signal SH10 to the second shift register SR21 via the eighth switch T24. At this time, the corresponding logic circuit 214 and the corresponding buffer 216 transform the fifth shifted signal SH10 into the second gate driving signal S4. The fourth shift register SR12 generates the sixth shifted signal SH4 according to the seventh shifted signal SH5 and outputs the sixth shifted signal SH4 to the first shift register SR11 via the fourth switch T22. Then, the second shift register SR21 generates the fourth shifted signal SH9 according to the fifth shifted signal SH10 and outputs the fourth shifted signal SH9 to the ninth shift register SR34 via the seventeenth switch T46. The first shift register SR11 generates the second shifted signal SH3 according to the sixth shifted signal SH4 and outputs the second shifted signal SH3 to the fifth shift register SR32 via the ninth switch T42. At this time, the corresponding logic circuit 210 and the corresponding buffer 212 transform the second shifted signal SH3 into the first gate driving signal S3.

Next, the ninth shift register SR34 generates the third shifted signal SH8 according to the fourth shifted signal SH9 and outputs the third shifted signal SH8 to the tenth shift register SR33 via the nineteenth switch T45. The fifth shift register SR32 generates the first shifted signal SH2 according to the second shifted signal SH3 and outputs the first shifted signal SH2 to the sixth shift register SR31 via the eleventh switch T41. At this time, the corresponding logic circuit and the corresponding buffer transform the first shifted signal SH2 into the fourth gate driving signal S2. Then, the tenth shift register SR33 generates the tenth shifted signal SH7 according to the third shifted signal SH8 and the sixth shift register SR31 generates the ninth shifted signal SH1 according to the first shifted signal SH2. At this time, the corresponding logic circuit and the corresponding buffer transform the ninth shifted signal SH1 into the third gate driving signal S1. Since the second gate driving signal S4 is generated according to the fifth shifted signal SH10 and the first gate driving signal S3 is generated according to the second shifted signal SH3, the second gate driving signal S4 is generated before than the first gate driving signal S3.

The signal (e.g. the seventh shifted signal SH5) transmitted by the third switch T21 is generated by the seventh shift register SR41 and the eighth shift register SR42. The signal (e.g. the eighth shifted signal SH11) transmitted by the seventh switch T23 is generated by the eleventh shift register SR43 and the twelfth shift register SR44. Since the number of the shift registers (e.g. SR41 and SR42) is the same as the number of the shift registers (e.g. SR43 and SR44), the seventh shifted signal SH5 is transmitted to the input terminal In12 of the shift register SR12 and simultaneously, the eighth shifted signal SH11 is transmitted to the input terminal In22 of the shift register SR22 during the second period. In other words, the eleventh shifted signal SH6 and the twelfth shifted signal SH12 are simultaneously generated. The seventh shifted signal SH5 and the eighth shifted signal SH11 are simultaneously generated. The sixth shifted signal SH4 and the fifth shifted signal SH10 are simultaneously generated and so on. In this embodiment, the control chip 206 does not have a complex circuit design and unnecessary pins and the control chip 206 is capable of utilizing an anti-scan stage of a monitor.

The sixth shift register SR31 of the first side driving circuit 202_1 is coupled to a corresponding logic circuit and a corresponding buffer to generate the third gate driving signal S1 for driving a corresponding row of the pixel array 204. The sixth shift register SR32 of the first side driving circuit 202_1 is coupled to a corresponding logic circuit and a corresponding buffer to generate the fourth gate driving signal S2 for driving a corresponding row of the pixel array 204. Each of the ninth shift register SR34 and the tenth shift register SR33 of the second side driving circuit 202_2 are not coupled to a corresponding logic circuit and a corresponding buffer. Additionally, the eleventh shift register SR43 of the second side driving circuit 202_2 is coupled to a corresponding logic circuit and a corresponding buffer to generate the fifth gate driving signal S5 for driving a corresponding row of the pixel array 204. The twelfth shift register SR44 of the second side driving circuit 202_2 is coupled to a corresponding logic circuit and a corresponding buffer to generate the sixth gate driving signal S6 for driving a corresponding row of the pixel array 204. Each of the seventh shift register SR41 and the eighth shift register SR42 of the first side driving circuit 202_1 is not coupled to a corresponding logic circuit and a corresponding buffer.

Figure 3:
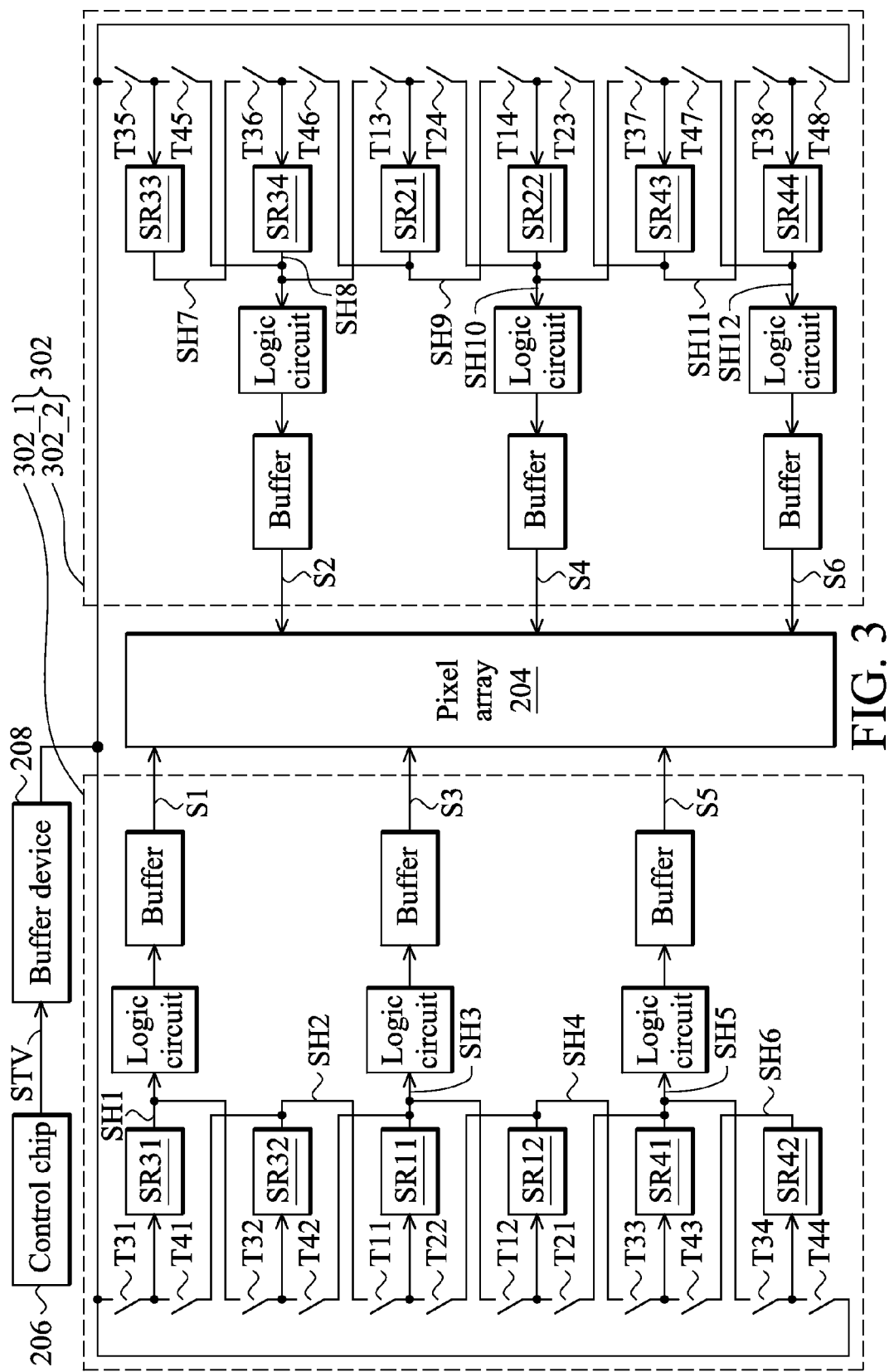
FIG. 3 is a schematic diagram of another exemplary embodiment of an image display system.

FIG. 3 is a schematic diagram of another exemplary embodiment of an image display system. The gate driver 302 comprises a first side driving circuit 302_1 and a second side driving circuit 302_2. The first side driving circuit 302_1 and the second side driving circuit 302_2 are disposed on both sides of the pixel array 204. Compared with FIG. 2, the gate driver 302 of FIG. 3 comprises switches T31-T38, T41-T48, shift registers SR31-SR34 and SR41-SR44. The designs of the switches T31-T38 and T41-T48 in FIG. 3 are the same as the designs of the switches T31-T38 and T41-T48 in FIG. 2. The connective relationship among the corresponding logic circuits, the corresponding buffers and the shift registers SR31-SR34 and SR41-SR44 in FIG. 3 are different from the connective relationships among the corresponding logic circuits, the corresponding buffers and the shift registers SR31-SR34 and SR41-SR44 in FIG. 2. Refer to FIG. 2, one driving circuit in one side of the pixel array 204 drives the successive row of the pixel array 204. For example, the first side driving circuit 202_1 provides the third gate driving signal S1 to drive a first row of the pixel array 204, provides the fourth gate driving signal S2 to drive a second row of the pixel array 204 and provides the first gate driving signal S3 to drive a third row of the pixel array 204. The second side driving circuit 202_2 provides the second gate driving signal S4 to drive a fourth row of the pixel array 204, provides the fifth gate driving signal S5 to drive a fifth row of the pixel array 204 and provides the sixth gate driving signal S6 to drive a sixth row of the pixel array 204. The first, the second, the third, the fourth, the fifth and the sixth rows are successively arranged. In FIG. 3, the first side driving circuit 302_1 and the second side driving circuit 302_2 are interlaced to provide driving signals to the pixel array 204. For example, in a right scan operation, the first side driving circuit 302_1 provides a third gate driving signal S1 to drive the first row of the pixel array 204, then the second side driving circuit 302_2 provides a fourth gate driving signal S2 to drive the second row of the pixel array 204, then the first side driving circuit 302_1 provides a first gate driving signal S3 to drive the third row of the pixel array 204 and so on. Finally, the second side driving circuit 302_2 provides a sixth gate driving signal S6 to drive the sixth row of the pixel array 204. For the anti-scan operation, the first side driving circuit 302_1 and the second side driving circuit 302_2 are interlaced so that sixth gate driving signal S6 drives the sixth row of pixels, the fifth gate driving signal S5 drives the fifth row of pixels, the second gate driving signal S4 drives the fourth row of pixels, the first gate driving signal S3 drives the third row of pixels, the fourth gate driving signal S2 drives the second row of pixels, and the third gate driving signal S1 drives the first row of pixels.

Figure 4:
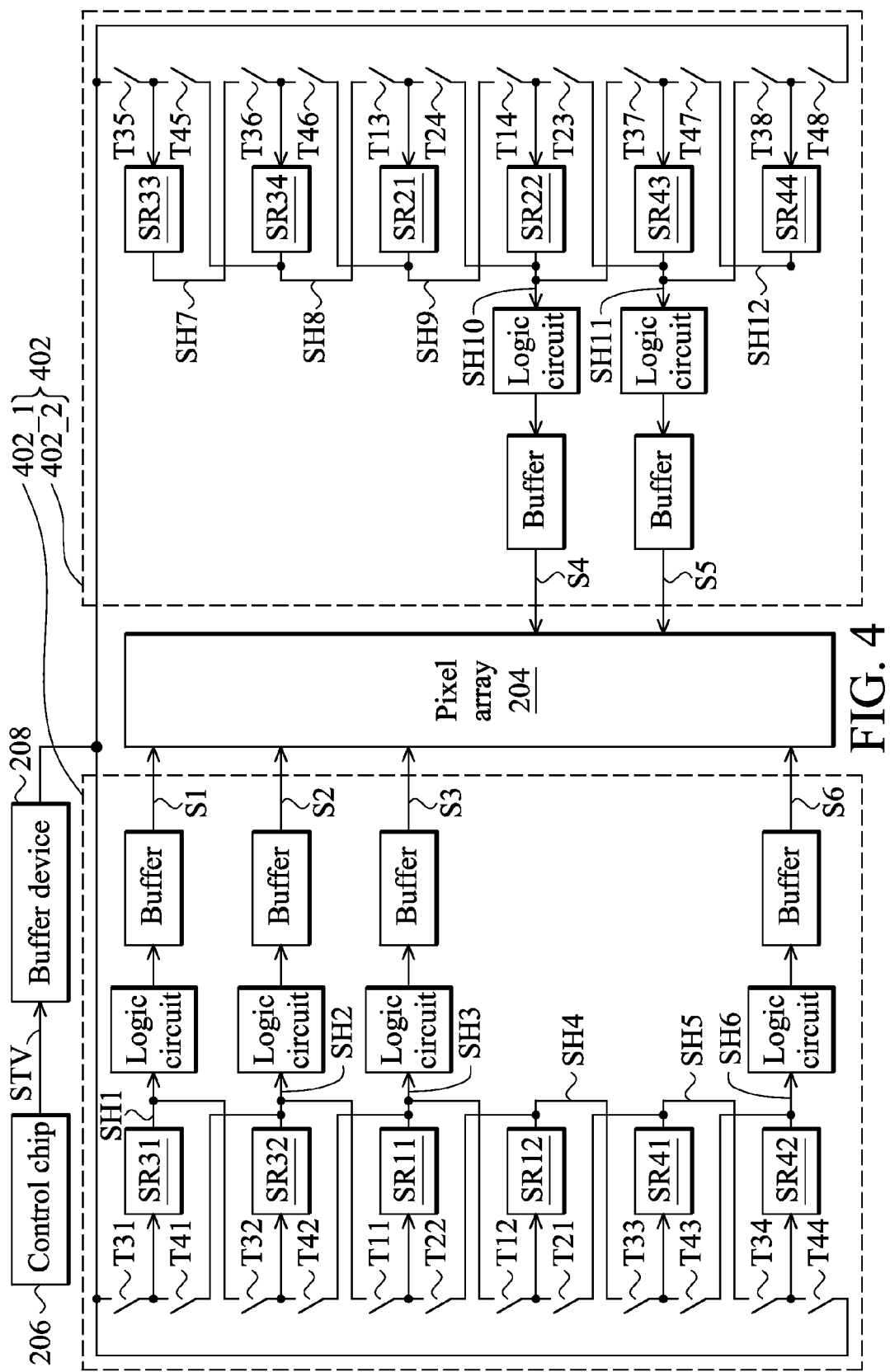
FIG. 4 is a schematic diagram of another exemplary embodiment of an image display system.

FIG. 4 is a schematic diagram of another exemplary embodiment of an image display system. The gate driver 402 comprises a first side driving circuit 402_1 and a second side driving circuit 402_2. The first side driving circuit 402_1 and the second side driving circuit 402_2 are disposed on both sides of the pixel array 204. Compared with FIGS. 2 and 3, the gate driver 402 of FIG. 4 comprises switches T31-T38, T41-T48, shift registers SR31-SR34 and SR41-SR44. The designs of the switches T31-T38 and T41-T48 in FIG. 4 are the same as the designs of the switches T31-T38 and T41-T48 in FIG. 2 or FIG. 3. The connective relationships among the corresponding logic circuits, the corresponding buffers and the shift registers SR31-SR34 and SR41-SR44 in FIG. 4 are different from the connective relationships among the corresponding logic circuits, the corresponding buffers and the shift registers SR31-SR34 and SR41-SR44 in FIG. 2 or FIG. 3. In FIG. 4, the first side driving circuit 402_1 and the second side driving circuit 402_2, utilize an asymmetric method to provide the gate driving signals S1-S6. For example, for the right-scan operation, the first side driving circuit 402_1 sequentially provides a third gate driving signal S1, a fourth gate driving signal S2 and a first gate driving signal S3 to the first row, the second row and the third row of pixels of the pixel array 204 and then the second side driving circuit 402_2 sequentially provides a second gate driving signal S4 and a fifth gate driving signal S5 to the fourth row and the fifth row of pixels of the pixel array 204 and finally the first side driving circuit 402_1 provides a sixth gate driving signal S6 to the sixth row of pixels of the pixel array 204. For the anti-scan operation, the first side driving circuit 402_1 provides the sixth gate driving signal S6 to the sixth row of pixels of the pixel array 204, then the second side driving circuit 402_2 sequentially provides the fifth gate driving signal S5 and the second gate driving signal S4 to the fifth row and the fourth row of pixels of the pixel array 204 and finally the first side driving circuit 402_1 sequentially provides the first gate driving signal S3, the fourth gate driving signal S2 and the third gate driving signal S1 to the third row, the second row and the first row of pixels of the pixel array 204.

The exemplary embodiments shown in FIGS. 2-4 do not limit the invention. In other embodiments, other connective relationships between shift registers and switches can be performed according to the exemplary embodiments shown in FIG. 2, 3 or 4.

Figure 5A:
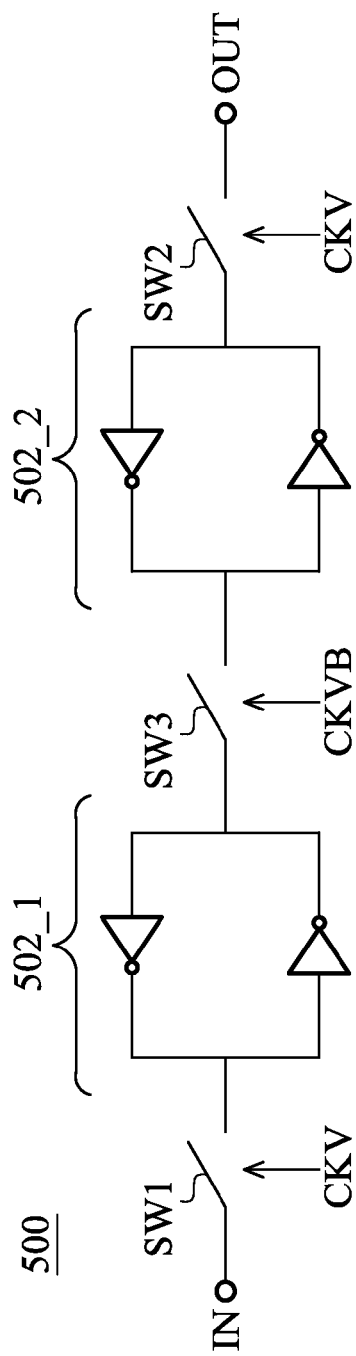
FIG. 5A is a schematic diagram of an exemplary embodiment of a shift register.
Figure 5B:
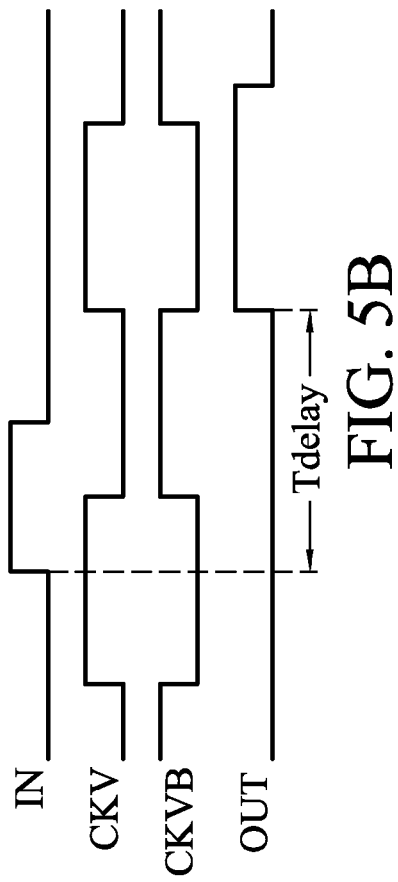
FIG. 5B is a timing diagram of the shift register shown in FIG. 5A.

FIG. 5A is a schematic diagram of an exemplary embodiment of a shift register. The shift register 500 comprises latches 502_1, 502_2 and switches SW1-SW3. The switches SW1 and SW2 are controlled by a control signal CKV. The switch SW3 is controlled by a control signal CKVB. The control signal CKV is inverted to the control signal CKVB. The control signals CKV and CKVB are oscillation signals. FIG. 5B is a timing diagram of the shift register shown in FIG. 5A. When the control signal CKV is high, the switch SW1 is turned on. When a signal in the input terminal IN is at a high level, the latch 502_1 receives a high signal via the input terminal IN. At this time, a signal in the output terminal of the latch 502_1 is at a low level. When control signal CKV is switched from the high level to the low level, the switch SW1 cuts off the connective relationships between the input terminal and the latch 502_1. The control signal CKVB is switched from the low to the high level. The output terminal of the latch 502_2 outputs a high signal according to the signal in the output terminal of the latch 502_1. Thus, the high signal in the input terminal IN of the latch 502_1 is provisionally stored in the latch 502_2. When the control signal CKV is switched from the low level to the high level and the control signal CKVB is switched from the high level to the low level, the switch SW3 is turned off to cut off the connection between the latches 502_1 and 502_2. The switch SW2 is turned on such that the output terminal OUT provides the high signal stored in the latch 502_2 to a next shift register (not shown). The signal in the output terminal OUT serves as a shifted signal. The maintenance time of the high signal is determined by an enable signal (not shown). A delay time occurs between the signal in the output terminal OUT and the signal in the input terminal IN.

Figure 5C:
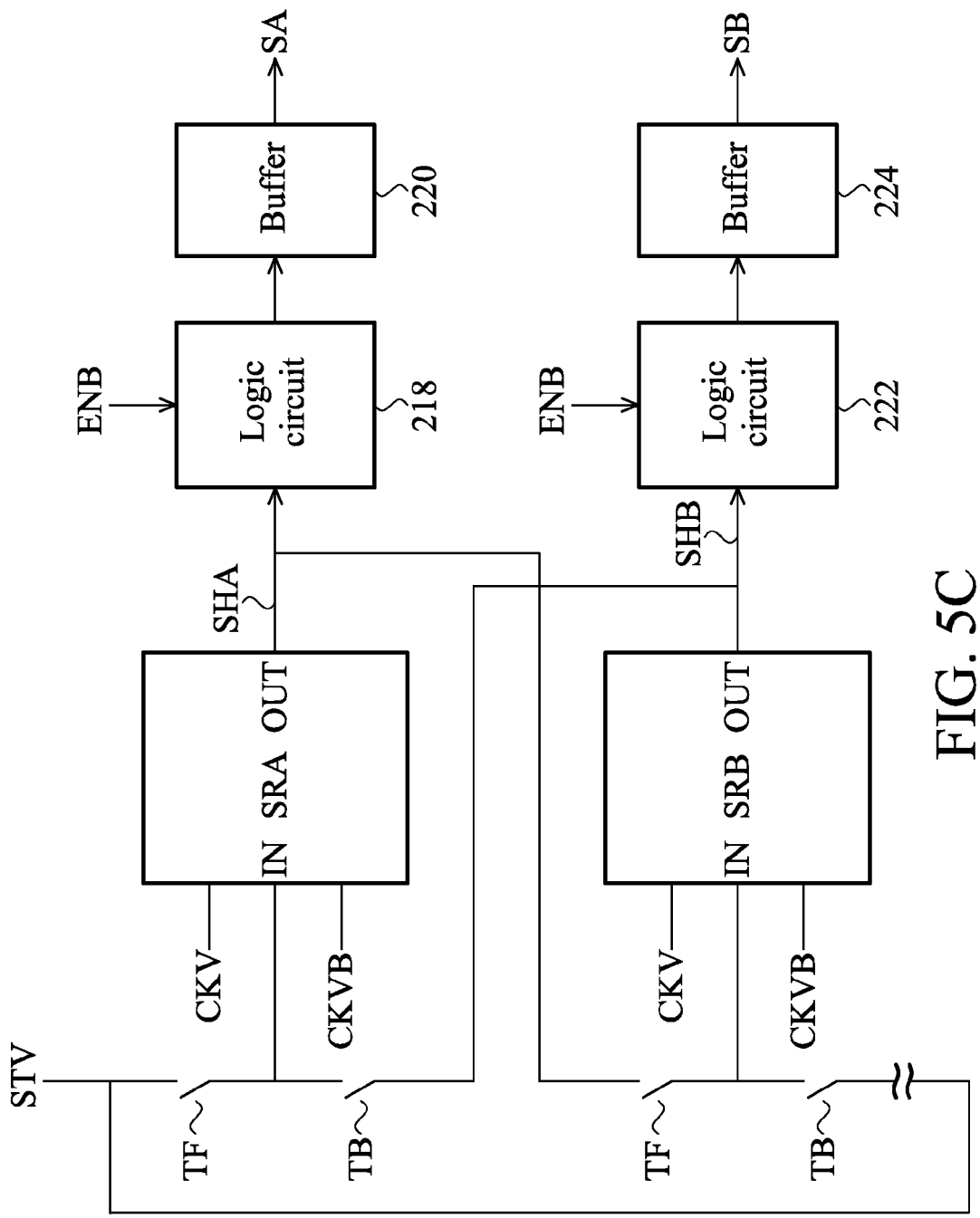
FIG. 5C is a schematic diagram of an exemplary embodiment of first and second side driving circuits.

FIG. 5C is a schematic diagram of an exemplary embodiment of first and second side driving circuits. For clarity, only two shift registers and the corresponding switches are shown. As shown in FIG. 5C, the shift registers SRA and SRB are any two shift registers of FIG. 2, 3 or 4. For example, assuming the shift register SRA in FIG. 5C is the sixth shift register SR31 in FIG. 2 and the shift register SRB in FIG. 5C is the fifth shift register SR32 in FIG. 2. The top-switch TF in FIG. 5C is the twelfth switch T31 in FIG. 2 and the bottom-switch TF in FIG. 5C is the tenth switch T32 in FIG. 2. The top-switch TB in FIG. 5C is the eleventh switch T41 in FIG. 2 and the bottom-switch TB in FIG. 5C is the ninth switch T42 in FIG. 2. Assuming the shift register SRA in FIG. 5C is the tenth shift register SR33 in FIG. 2 and the shift register SRB in FIG. 5C is the ninth shift register SR34 in FIG. 2. The top-switch TF in FIG. 5C is the twentieth switch T35 in FIG. 2 and the bottom-switch TF in FIG. 5C is the eighteenth switch T36 in FIG. 2. The top-switch TB in FIG. 5C is the nineteenth switch T45 in FIG. 2 and the bottom-switch TB in FIG. 5C is the seventeenth switch T46 in FIG. 2. Assuming the shift register SRA in FIG. 5C is the first shift register SR11 in FIG. 2 and the shift register SRB in FIG. 5C is the fourth shift register SR12 in FIG. 2. The top-switch TF in FIG. 5C is the first switch T11 in FIG. 2 and the bottom-switch TF in FIG. 5C is the second switch T12 in FIG. 2. The top-switch TB in FIG. 5C is the fourth switch T22 in FIG. 2 and the bottom-switch TB in FIG. 5C is the third switch T21 in FIG. 2. The logic circuit 222 and the buffer 224 corresponding to the shift register SRB are omitted. Assuming the shift register SRA in FIG. 5C is the seventh shift register SR41 in FIG. 2 and the shift register SRB in FIG. 5C is the eighth shift register SR42 in FIG. 2. The top-switch TF in FIG. 5C is the thirteenth switch T33 in FIG. 2 and the bottom-switch TF in FIG. 5C is the fifteenth switch T34 in FIG. 2. The top-switch TB in FIG. 5C is the fourteenth switch T43 in FIG. 2 and the bottom-switch TB in FIG. 5C is the sixteenth switch T44 in FIG. 2.

Figure 5D:
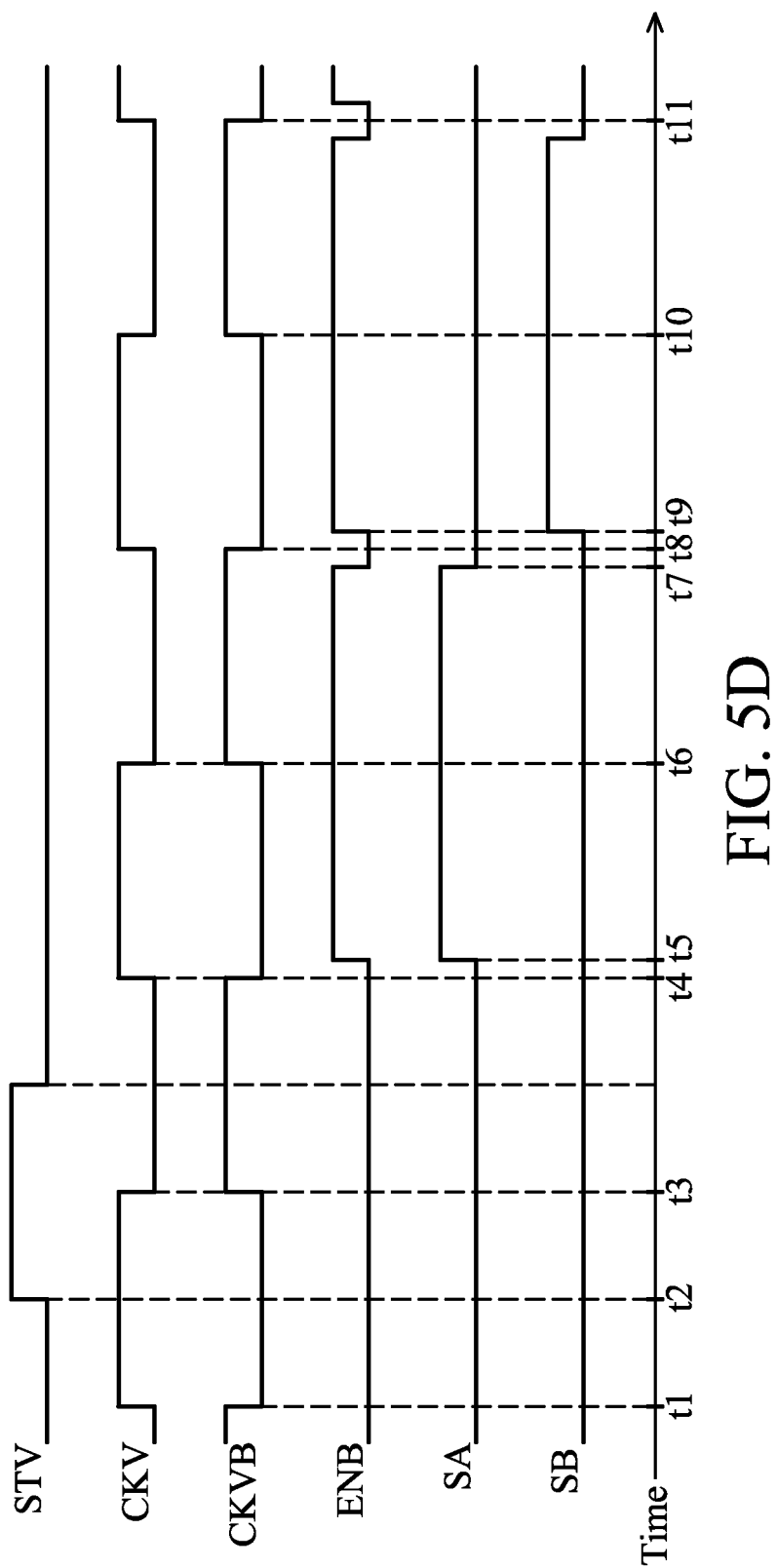
FIG. 5D is a timing diagram of the first and the second side driving circuits shown in FIG. 5C.

FIG. 5D is a timing diagram of the first and the second side driving circuits shown in FIG. 5C. The symbol STV represents a vertical start pulse. The symbol CKV represents a control signal for controlling the switches SW1 and SW2. The symbol CKVB represents a control signal for controlling the switch SW3. The symbol ENB represents an enable signal for enabling the logic circuits 218 and 222. The symbols SA and SB represent gate driving signals provided to the pixel array 204. In this embodiment, the control signals CKV, CKVB and enable signal ENB are provided by the control chip 206 shown in FIGS. 2-4 or provided by a timing controller, but the disclosure is not limited thereto.

During the time t2-t3, since the control signal CKV is high, the shift register SRA receives the vertical start pulse STV. Then, during the time t3-t4, since the control signal CKVB is high and the control signal CKV is low, the shift register SRA latches onto the received signal. At time t4, since the control signal CKV is changed to high and the control signal CKVB is changed to low, the shift register SRA outputs a shifted signal SHA to the logic circuit 218 and next shift register SRB. At this time, the shift register SRB receives the shifted signal SHA provided by the shift register SRA because the control signal CKV is high. Additionally, since the enable signal ENB is low, the logic circuit 218 does not enable the buffer 220 according to the shifted signal SHA provided by the shift register. Thus, the buffer 220 does not output the gate driving signal SA.

At time t5, since the enable signal ENB is changed from low to high, the logic circuit 218 enables the buffer 220 according to the shifted signal SHA provided by the shift register SRA such that the buffer 220 outputs the gate driving signal SA. At time t6, the control signal CKVB is changed to high and the control signal CKV is changed to low, and the shift register SRB latches onto the received signal. At time t7, since the enable signal ENB is changed from high to low, the logic circuit 218 controls the buffer 220 such that the buffer 220 stops outputting the gate driving signal SA.

At time t8, since the control signal CKV is changed to high and the control signal CKVB is changed to low, the shift register SRB provides a shifted signal SHB to the logic circuit 222 and next shift register (not shown). At this time, the next shift register receives the shifted signal SHB because the control signal CKV is changed to high. Since the enable signal ENB is low, the logic circuit 222 does not enable the buffer 224 according to the shifted signal SHB provided by the shift register SRB such that the buffer 224 does not output the gate driving signal SB.

At time t9, since the enable signal ENB is changed from low to high, the logic circuit 222 enables the buffer 224 according to the shifted signal SHB provided by the shift register SRB such that the buffer 224 outputs the gate driving signal SB. At time t10, since the control signal CKVB is high and the control signal CKV is low, the next shift register latches onto the received signal. Then, at time t11, since the enable signal ENB is changed from high to low, the logic circuit 222 controls the buffer 224 to stop outputting the gate driving signal SB. The right-scan operation and the anti-scan operation in FIG. 2, 3 or 4 can be deduced by reason; thus, descriptions thereof are omitted for brevity.

Figure 6:
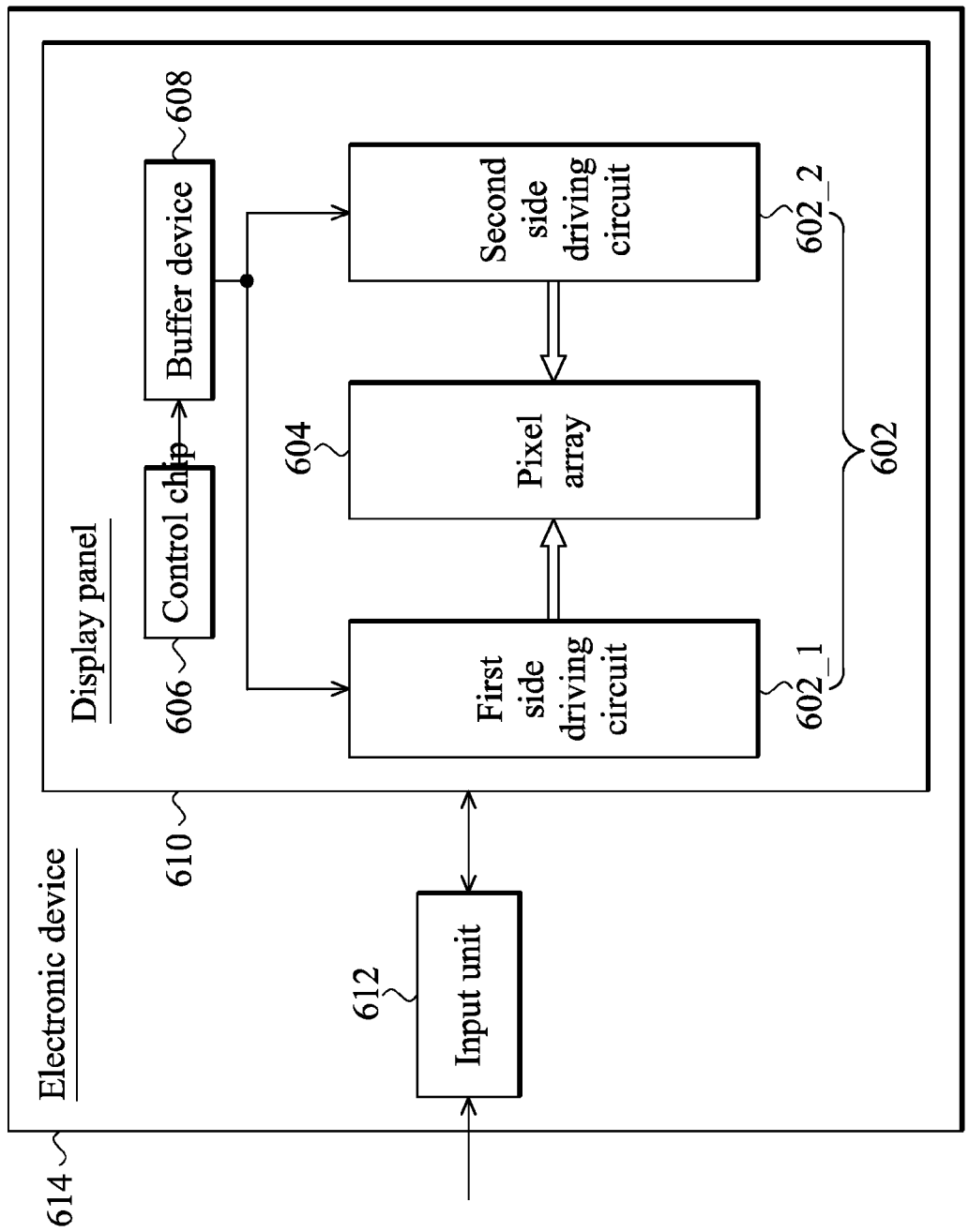
FIG. 6 is a schematic diagram of an exemplary embodiment of an image display system.

FIG. 6 is a schematic diagram of an exemplary embodiment of an image display system. The image display system may comprise a display panel 610. The display panel 610 comprises a gate driver 602, a pixel array 604, a control chip 606 and a buffer device 608. The gate driver 602 comprises a first side driving circuit 602_1 and a second side driving circuit 602_2. The gate driver 602, the pixel array 604, the control chip 606 and the buffer device 608 can be achieved according to the above embodiments.

In addition, the image display system may comprise an electronic device 614. The electronic device 614 comprises the display panel 610 and an input unit 612. The input unit 612 receives signals and provides the received signal to control the display panel 610 such that the display panel 610 displays an image.

The electronic device 614 can be a mobile phone, a digital camera, a personal digital assistant (PDA), a notebook computer (NB), a personal computer (PC), a television, a car display or a mobile compact disk (CD) player.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image display system, comprising:
    a pixel array comprising a first row of pixels and a second row of pixels;
    a control chip generating a vertical start pulse; and
    a gate driver driving the pixel array and comprising:
    a first side driving circuit disposed on a first side of the pixel array and comprising:
    a first shift register coupled to the pixel array, wherein the first shift register receives a first shifted signal to generate a second shifted signal during a first period such that the gate driver outputs a first gate driving signal to the pixel array for driving the first row of pixels; and
    a second side driving circuit disposed on a second side of the pixel array, wherein the first side is opposite to the second side and the second side driving circuit comprises:

a second shift register receiving a third shifted signal to generate a fourth shifted signal during the first period, wherein the first and the third shifted signals are simultaneously generated according to the vertical start pulse and the second and the fourth shifted signals are simultaneously output; and a third shift register coupled to the second shift register, wherein the third shift register receives the fourth shifted signal to generate a fifth shifted signal during the first period such that the gate driver outputs a second gate driving signal to drive the second row of pixels.

2. The image display system as claimed in claim 1, wherein the first side driving circuit further comprises:

a fourth shift register coupled to the first shift register, wherein the fourth shift register receives the second shifted signal to generate a sixth shifted signal during the first period, and the fifth and the sixth shifted signals are simultaneously output.

3. The image display system as claimed in claim 2, wherein the first side driving circuit further comprises:

a first switch coupled between an input terminal of the first shift register and the control chip;

a second switch coupled between an output terminal of the first shift register and an input terminal of the fourth shift register;

a third switch coupled between the input terminal of the fourth shift register and the control chip to transmit a seventh shifted signal during a second period, wherein the seventh shifted signal is generated according to the vertical start pulse; and a fourth switch coupled between an output terminal of the fourth shift register and the input terminal of the first shift register, wherein the second side driving circuit further comprises:

a fifth switch coupled between an input terminal of the second shift register and the control chip;

a sixth switch coupled between an output terminal of the second shift register and an input terminal of the third shift register;

a seventh switch coupled between the input terminal of the third shift register and the control chip to transmit an eighth shifted signal during the second period, wherein the eighth shifted signal is generated according to the vertical start pulse, and the seventh and the eighth shifted signals are simultaneously generated according to the vertical start pulse; and an eighth switch coupled to an output terminal of the third shift register and the input terminal of the second shift register, wherein the first, the second, the fifth and the sixth switches are turned on during the first period and the first, the second, the fifth and the sixth switches are turned off during the second period, and wherein the third, the fourth, the seventh and the eighth switches are turned off during the first period and the third, the fourth, the seventh and the eighth switches are turned on during the second period.

4. The image display system as claimed in claim 3, wherein when the first, the second, the fifth and the sixth switches are turned on during the first period, the first shift register receives the first shifted signal via the first switch and the first shift register outputs the second shifted signal to the fourth shift register via the second switch, and the second shift register receives the third shifted signal via the fifth switch and the second shift register outputs the fourth shifted signal to the third shift register via the sixth switch, and when the third, the fourth, the seventh and the eighth switches are turned on during the second period, the fourth shift register receives the seventh shifted signal via the third switch, the fourth shift register generates the sixth shifted signal according to the seventh shifted signal and the fourth shift register outputs the sixth shifted signal to the first shift register via the fourth switch, and the third shift register receives the eighth shifted signal via the seventh switch, generates the fifth shifted signal according to the eighth shifted signal and outputs the fifth shifted signal to the second shift register via the eighth switch.

5. The image display system as claimed in claim 3, wherein the first side driving circuit further comprises:

a fifth shift register disposed between the first switch and the control chip;

a sixth shift register disposed between the fifth shift register and the control chip;

a seventh shift register disposed between the third switch and the control chip; and an eighth shift register disposed between the seventh shift register and the control chip, wherein the second side driving circuit comprises:

a ninth shift register disposed between the fifth switch and the control chip;

a tenth shift register disposed between the ninth shift register and the control chip;

an eleventh shift register disposed between the seventh switch and the control chip; and a twelfth shift register disposed between the eleventh shift register and the control chip, wherein the fifth and the sixth shift registers provide the first shifted signal according to the vertical start pulse during the first period, wherein the ninth and the tenth shift registers provide the third shifted signal according to the vertical start pulse during the first period, wherein the seventh and the eighth shift registers provide the seventh shifted signal according to the vertical start pulse during the second period, and wherein the eleventh and the twelfth shift registers provide the eighth shifted signal according to the vertical start pulse during the second period.

6. The image display system as claimed in claim 5, wherein each of the output terminals of the first, the third, the fifth, the sixth, the eleventh and the twelfth shift registers is coupled to the pixel array via a corresponding logic circuit and a corresponding buffer, wherein each of the output terminals of the first, the third, the fifth, the sixth, the eleventh and the twelfth shift registers is connected to the corresponding logic circuit and the corresponding buffer in series, and wherein each of the output terminals of the second, the fourth, the seventh, the eighth, the ninth and the tenth shift registers is not coupled to a logic circuit and a buffer.

7. The image display system as claimed in claim 5, wherein each of the output terminals of the first, the third, the sixth, the seventh, the ninth and the twelfth shift registers is coupled to the pixel array via a corresponding logic circuit and a corresponding buffer, wherein each of the output terminals of the first, the third, the sixth, the seventh, the ninth and the twelfth shift registers is connected to the corresponding logic circuit and the corresponding buffer in series, and wherein each of the output terminals of the second, the fourth, the fifth, the eighth, the tenth and the eleventh shift registers is not coupled to a logic circuit and a buffer.

8. The image display system as claimed in claim 5, wherein each of the output terminals of the first, the third, the fifth, the sixth, the eighth and the eleventh shift registers is coupled to the pixel array via a corresponding logic circuit and a corresponding buffer, wherein each of the output terminals of the first, the third, the fifth, the sixth, the eighth and the eleventh shift registers is connected to the corresponding logic circuit and the corresponding buffer in series, and wherein each of the output terminals of the second, the fourth, the seventh, the ninth, the tenth and the twelfth shift registers is not coupled to a logic circuit and a buffer.

9. The image display system as claimed in claim 5, wherein the first side driving circuit further comprising:

a ninth switch coupled between the output terminal of the first shift register and an input terminal of the fifth shift register;

a tenth switch coupled between the input terminal of the fifth shift register and an output terminal of the sixth shift register;

an eleventh switch coupled between an output terminal of the fifth shift register and an input terminal of the sixth shift register;

a twelfth switch coupled between the input terminal of the sixth shift register and the control chip;

a thirteenth switch coupled between the output terminal of the fourth shift register and an input terminal of the seventh shift register;

a fourteenth switch coupled between the input terminal of the seventh shift register and an output terminal of the eighth shift register;

a fifteenth switch coupled between an output terminal of the seventh shift register and an input terminal of the eighth shift register; and a sixteenth switch coupled between the input terminal of the eighth shift register and the control chip, wherein the second side driving circuit further comprises:

a seventeenth switch coupled between the output terminal of the second shift register and an input terminal of the ninth shift register;

an eighteenth switch coupled between the input terminal of the ninth shift register and an output terminal of the tenth shift register;

a nineteenth switch coupled between the output terminal of the ninth shift register and the input terminal of the tenth shift register;

a twentieth switch coupled between the input terminal of the tenth shift register and the control chip;

a twenty-first switch coupled between the output terminal of the third shift register and an input terminal of the eleventh shift register;

a twenty-second switch coupled between the input terminal of the eleventh shift register and an output terminal of the twelfth shift register;

a twenty-third switch coupled between an output terminal of the eleventh shift register and the input terminal of the twelfth shift register; and a twenty-fourth switch coupled between the input terminal of the twelfth shift register and the control chip, wherein the tenth, the twelfth, the thirteenth, the fifteenth, the eighteenth, the twentieth, the twenty-first, the twenty-third switches are turned on during the first period and are turned off during the second period, and wherein the ninth, the eleventh, the fourteenth, the sixteenth, the seventeenth, the nineteenth, the twenty-second and the twenty-fourth are turned off during the first period and are turned on during the second period.

10. The image display system as claimed in claim 1, further comprising a display panel, wherein the display panel comprises the gate driver, the control chip and the pixel array.

11. The image display system as claimed in claim 10, further comprising an electronic device, wherein the electronic device comprises the display panel and an input unit and wherein the input unit receives signals such that the display panel displays an image.

12. The image display system as claimed in claim 11, wherein the electronic device is a mobile phone, a digital camera, a personal digital assistant (PDA), a notebook computer (NB), a personal computer (PC), a television, a car display or a mobile compact disk (CD) player.

13. The image display system as claimed in claim 1, wherein the first row of pixels is different from the second row of pixels.

14. The image display system as claimed in claim 1, wherein the pixel array comprises a top half pixels and a bottom half pixels, the top half pixels comprises the first row of pixels, the bottom half pixels comprises the second row of pixels, the top half pixels are not driven by the second side driving circuit and the bottom half pixels are not driven by the first side driving circuit.

* * * * *